United States Patent [19]

Su

[11] Patent Number: 5,058,060
[45] Date of Patent: Oct. 15, 1991

[54] OPTICAL MEMORY CELL

[75] Inventor: Shing-Fong Su, Southboro, Mass.

[73] Assignee: GTE Laboratories Incorporated, Waltham, Mass.

[21] Appl. No.: 511,888

[22] Filed: Apr. 19, 1990

Related U.S. Application Data

[63] Continuation-in-part of Ser. No. 280,396, Dec. 5, 1988, abandoned.

[51] Int. Cl.$^5$ .................... G11C 19/30; G11C 13/04
[52] U.S. Cl. .................... 365/106; 365/215; 365/73; 385/13
[58] Field of Search .... 365/106 O, 120 NG, 126 NG, 365/127 NG, 215 X, 112 NG, 234, 73; 350/96.15, 96.16, 96.17, 96.3

[56] References Cited

U.S. PATENT DOCUMENTS

| | | | |
|---|---|---|---|
| 4,536,058 | 8/1985 | Shaw et al. | 350/320 |
| 4,558,920 | 12/1985 | Newton et al. | 350/96.16 X |
| 4,652,079 | 3/1987 | Shaw et al. | 350/96.16 X |
| 4,815,804 | 3/1989 | Desurvire et al. | 350/96.15 |
| 4,846,542 | 7/1989 | Okayama et al. | 350/96.15 |
| 4,863,230 | 9/1989 | Webb | 350/96.16 X |
| 4,877,952 | 10/1989 | Halemane et al. | 365/106 X |
| 4,886,334 | 12/1989 | Aoki | 350/96.16 X |
| 4,923,267 | 5/1990 | Su | 350/96.16 |

FOREIGN PATENT DOCUMENTS 0078140 5/1983 European Pat. Off. ............. 365/73

OTHER PUBLICATIONS

P. R. Prucnal, D. J. Blumenthal, and P. A. Perrier, "Self-Routing Photonic Switching Demonstration with Optical Control," Optical Engineering, vol. 26, pp. 473-477, May 1987.

D. J. Albares, G. A. Garcia, C. T. Chang, and R. E. Reedy, "Optoelectronic Time Division Multiplexing," Electronics Letters, vol. 23, pp. 327-328, Mar. 1987.

P. R. Prucnal, M. A. Santoro, S. K. Sehgal, "TDMA Fiber-Optic Network with Optical Processing", Electronics Letters, vol. 22, pp. 1218-1219, Nov. 1986.

R. A. Thompson and P. O. Giordano, "An Experimental Photonic Time-Slot Interchanger Using Optical Fibers as Reentrant Delay-Line Memories," J. Lightwave Technology, vol. LT-5, pp. 154-162, Jan. 1987.

S. R. Friberg, Y. Silberberg, M. K. Oliver, M. J. Andrejco, M. A. Salfi, and P. W. Smith, "An Ultrafast All-Optical Switch," Photonic Switching, Springer Series in Electronics and Photonics 25, pp. 92-94, 1988.

Primary Examiner—Alyssa H. Bowler
Attorney, Agent, or Firm—Victor F. Lohmann, III

[57] ABSTRACT

An optical memory cell constructed from an optical combiner, a 1×2 optical swtich and optical fibers. One input port of the optical combiner serves as the input to the memory cell. The output port of the optical combiner is connected to the input of the optical switch by an optical fiber. A first output port of said switch is connected by an optical fiber to the second input of the optical combiner, such that when said switch is in the straight-through state, an optical loop is formed through which an optical pulse can circulate. The second output of the optical switch serves as the output of the memory cell when said optical switch is in the crossover state. Control signals are provided by a clock.

16 Claims, 1 Drawing Sheet

OPTICAL MEMORY CELL

This is a continuation-in-part of copending application Ser. No. 07/280,396 filed on Dec. 5, 1988 now abandoned.

BACKGROUND OF THE INVENTION

This invention relates to optical components generally, that is, components which operate in the optical domain. Such components are designed for use in various systems which utilize optical fibers, such as optical communications systems, optical data processing systems and optical switching systems. Specifically, it relates to an improved optical memory cell.

The development of optical fiber and optical semiconductor technologies in recent years has made possible various types of optical communications systems and optical switching systems. To utilize the full bandwidth and speed available in optical systems, it has become necessary to design and fabricate optical logic and switching components which eliminate the necessity for electrical-to-optical and optical-to-electrical conversions.

Optical memory cells are indispensable to time-division and self-routing optical switching systems. Currently, optical fiber delay lines are commonly used as memory cells in such systems, and are described in the literature. These delay lines are fixed in length and hence are not useful for switching systems which require flexible delays. A particular disadvantage is that the required physical length of such delay lines is usually very long. This causes the delay lines to be very bulky.

Recently a reentrant delay line memory, comprising a directional coupler and a multiple-loop delay line fiber, has been developed and demonstrated in an experimental photonic time-slot interchanger, R. A. Thompson and P. O. Giordano, "An experimental photonic time-slot interchanger using optical fibers as reentrant delay-line memories," J. Lightwave Technologies, vol. LT-5, pp. 154-162, Jan. 1987. In such a reentrant delay line memory, an input port and an output port of a directional coupler are connected by a delay line fiber to form a closed loop. The other input port and output port of the directional coupler are used for receiving and outputting the optical pulse, respectively. The directional coupler can be operated in the straight-through state or in the cross-over state. In the straight-through state, an optical packet in the delay line fiber will circulate around the closed loop formed by the delay line fiber and the directional coupler. The optical packet consists of optical pulses each representing a digital signal bit. In the cross-over state, the optical packet may enter the delay line fiber and/or exit from it. These conventional structures which circulate multiple-pulse optical packets are operationally disadvantageous. In particular, since the delay-line fiber is much longer than the pulse width of one optical pulse in order to accommodate the entire optical packet, the memory device requires a very precise timing control of the operational states of the directional coupler. Without this precision, an optical pulse may be split into two consecutive pulses during outputting, causing cross-talk between time slots. Furthermore, this precision is necessary to prevent destruction of the pulse sequence which occurs when individual pulses in a multi-bit optical packet are unintentionally interchanged during outputting, resulting in an output pulse train that is improperly sequenced relative to the input packet sequence.

SUMMARY OF THE INVENTION

The principal object of the present invention is to provide an optical memory cell which is simple in both structure and operation, while having none of the shortcomings of the prior art optical memory devices.

Another object of the invention is to provide an optical memory cell which can be implemented using integrated optics technology.

Still another object of the invention is to provide an optical memory cell from which no part of an optical pulse can escape.

Still another object of the invention is to provide such a cell in which the physical length of the delay line fiber is very short such that the loop length of the cell is equal to the width of a single optical pulse.

A further object of the invention is to provide an optical memory cell in which there is no danger of splitting one optical pulse into two consecutive pulses.

Still a further object of the invention is to provide an optical memory cell for which the control timing is simple and not as critical as in the prior art.

Still a further object of the present invention is to construct an optical memory cell capable of receiving and circulating an input pulse while an optical switch in the cell remains in the same operational state, thereby obviating the need for precise controls on the switch.

In one aspect of the invention, an optical memory cell is constructed from a 1×2 optical switch operating in either a straight-through or cross-over state, a passive optical combiner and delay line fibers. One input port of the passive optical combiner serves as the entrance to the memory cell. One output port of the passive optical combiner and the input port of the optical switch are connected by an optical fiber. One output port of the optical switch and the other input port of the optical combiner are also connected by an optical fiber. The other output port of the optical switch serves as the exit of the memory cell. The optical combiner, optical fibers, and optical switch operating in a straight-through state form an optical loop whose length is equal to the width of an input optical loop whose length is equal to the width of an input optical pulse so that the entire loop is filled with light when the pulse is in the loop. When the optical switch is operated in its straight-through state, the optical pulse enters the cell and circulates around the loop continuously. Optionally, an optical amplifier may be inserted in the loop to compensate for losses. When it is desired to output the optical pulse from the memory cell, the optical switch is switched over to the cross-over state. The pulse originally circulating in the memory cell will exit through an output port of the switch.

In another aspect of the invention, the relative positions of the optical combiner and the optical switch are interchanged.

The above and other objects, features and advantages of this invention are illustrated in the following detailed description, in which reference is made to the accompanying drawings.

DESCRIPTION OF THE PREFERRED EMBODIMENTS

Figure 1:
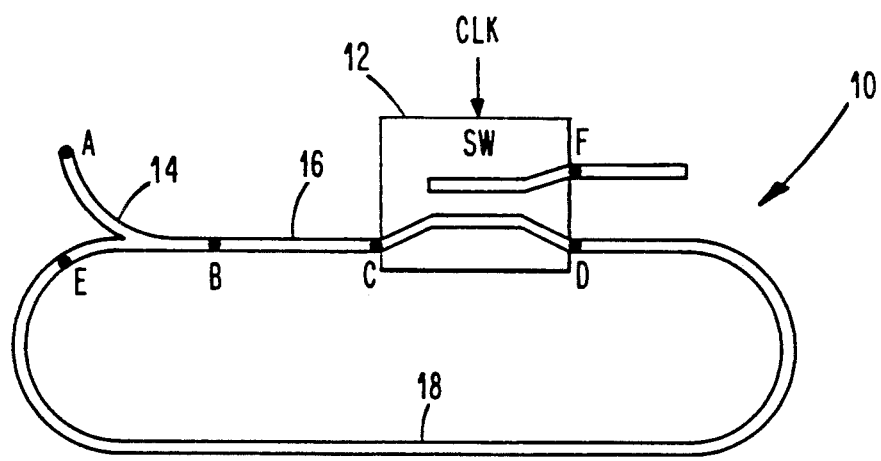
FIG. 1 is a diagrammatic illustration of the preferred embodiment of the optical memory cell of the present invention.

FIG. 1 is a diagrammatic illustration of the preferred embodiment of the optical memory cell 10 of the present invention. Memory cell 10 comprises a 1×2 optical switch 12, a passive optical combiner 14 and delay line fibers 16, and 18. The first input port A of passive optical combiner 14 and the input port C of optical switch 12 are connected by an optical fiber 16. Likewise, a first output port D of optical switch 12 and the second input port E of optical combiner 14 are connected by an optical fiber 18. The second output port F of optical switch 12 serves as the exit of memory cell 10.

The structure of memory cell 10 is independent of the type of 1×2 optical switch and independent of the type of optical combiner which may be used in its construction. Passive optical combiner 14 could be a fiber coupler or a waveguide coupler. The fibers 16, and 18 which are used must be compatible with both the optical switch 12 and the passive optical combiner 14.

In operation, 1×2 optical switch 12 can switch optical signals from input port C to either output port D or to output port F. For convenience, we will use the expression "straight-through" state to designate C-to-D switching, and the expression "cross-over" state to designate C-to-F switching. When the optical switch 12 is in its straight-through state, combiner 14, fiber 16, switch 12, and fiber 18 form a closed optical loop capable of storing a circulating optical pulse. The delay-line fibers 16 and 18 used in the memory cell of the present invention are relatively short in length such that the loop length of the cell is equal to the width of a single optical pulse. Thus, an input pulse circulating in the closed loop during the straight-through state of switch 12 represents a single digital bit. An exemplary optical loop constructed in accordance with the present invention has a length of 5 cm, thereby accommodating the circulation of a single optical pulse with a 0.3 nanosecond pulse width. This example should not serve as a limitation of the present invention, as other possible loop lengths and pulse widths should be obvious to those skilled in the art.

Figure 3:
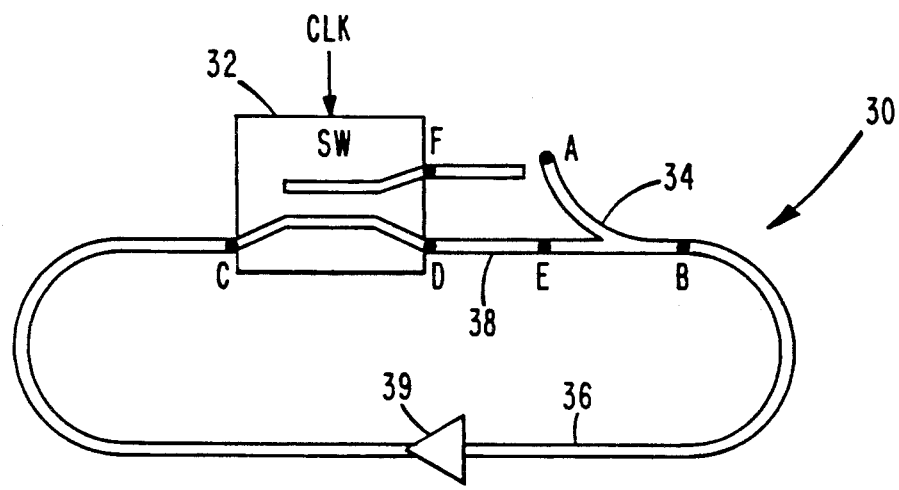
FIG. 3 is a diagrammatic illustration of an alternate structure for the optical memory cell of FIG. 1.

Optical memory cell 10 operates as follows. When 1×2 optical switch 12 is operated in the straight-through state, a single optical pulse may enter memory cell 10 via input port A and then circulate around the closed loop B-C-D-E-B continuously. Advantageously, the cell does not require precise controls on the switch 12 since the switch remains in a straight-through state after the pulse has entered the cell. The switch only changes to the other operational state (cross-over) when the pulse is to exit the cell, thereby requiring only simple controls on the switch. Conventional cells, however, are designed so as to require precise controls to change the operational state of the switch immediately after the pulses enter the cell. If the controls are not able to change the operational state of the switch before the pulses circulate around the cell loop, part of the pulse(s) will escape from the loop. Although optical losses may occur in the fiber during the circulation of the optical pulse around the loop, an optical amplifier may be inserted in the loop between ports B and C, or between ports D and E, to compensate for these losses. Such an optional optical amplifier 28 is shown in the embodiment of FIG. 3. When it is desired to output the stored optical pulse from memory cell 10, the 1×2 optical switch 12 is switched to the cross-over state. The stored optical pulse which was originally circulating in the memory cell 10 will then exit via output port F.

Figure 2:
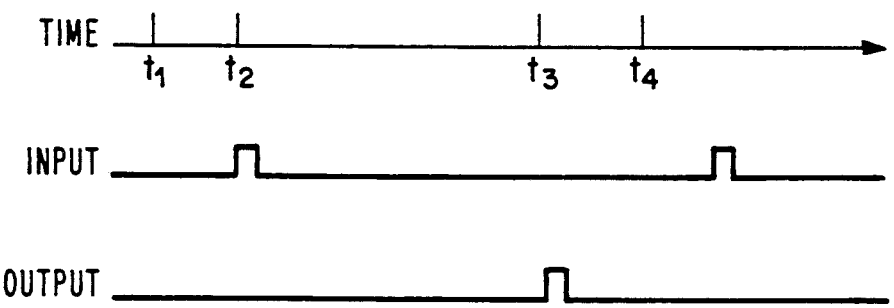
FIG. 2 is a timing control diagram of the optical memory cell of the present invention.

FIG. 2 is a diagram illustrating the timing control of memory cell 10 through an example. At time $t_1$ the 1×2 optical switch 12 is in the straight-through state. At time $t_2$, an optical pulse enters memory cell 10 and circulates around the loop B-C-D-E-B. At $t_3$ the 1×2 optical switch 12 is switched over the cross-over state, and the optical pulse circulating inside memory cell 10 exits from cell 10 through output port F. The memory duration is $T = t_3 - t_2$. This memory duration is flexible. It may range from subnanoseconds to microseconds, depending on system requirements and applications. At $t_4$ the 1×2 optical switch is switched back to the straight-through state, and memory cell 10 is ready to receive the next pulse.

FIG. 3 illustrates an alternate embodiment 30 of the invention and an extension thereof. As shown in FIG. 3, the passive optical combiner 34 is located behind the 1×2 optical switch 32. This transposition of the optical switch and the optical combiner from their positions in FIG. 1 does not change the function or operation of the memory cell.

A variety of 1×2 optical switches may be used in memory cell 10. At the present time, electro-optic switches, such as $LiNbO_3$-based directional couplers and cross-couplers, are good candidates for this application because their technologies are relatively mature compared with those of pure optical switching elements. A pure optical switching element, such as a nonlinear optical coupler, as described in Friberg et al., "An ultrafast all-optical switch," Photonic Switching, Springer Series in Electronics and Photonics 25, pp. 92–94, 1988, will be a better element to use when it becomes available and practical.

The memory cells 10, and 30 of the present invention can be implemented not only using discrete components, as shown in FIGS. 1 and 3, respectively, but also using integrated optics technology.

A variety of photonic systems, subsystems and/or components can be implemented which are based on and/or utilize the optical memory cell of the present invention, such as photonic shift registers, photonic serial-to-parallel and parallel-to-serial converters, photonic elastic stores and optical time slot interchangers.

The novel optical memory cell of the present invention offers many features and advantages over prior art devices. No part of the optical pulse will escape undesirably. The physical length of the delay-line fibers used in the memory cell are relatively short in length such that the length of the loop comprising the optical switch in its straight-through state, the combiner, and the fibers is equal to the width of a single optical pulse. This optical memory cell can be implemented using integrated optics technology, principally because the physical length of the optic fiber is short. Since the optical switch remains in a single operational (straight-through) state after the pulse has entered the cell and during the entire storage period, there is no danger of splitting one optical pulse into two consecutive pulses as might happen if the switch had to change states after the pulse entered the cell to form the closed optical loop but was unable to do this before the pulse circulated around the loop and reached the switch. Consequently, timing control of this novel memory cell is relatively easy.

I claim:

1. An optical memory cell, comprising:

an optical switch means having an input end adapted to receive an optical pulse, a first output end, a second output end and a switch control means, said switch means being adapted in response to control signals from said switch control means to switchably couple an optical pulse from said input end to said first output end in a straight-through state and to switchably couple an optical pulse from said input end to said second output end in a cross-over state;

an optical combiner having a first and a second input ends and an output end, adapted to receive an optical pulse on either input end and output said optical pulse on said output end;

a first optical fiber connecting said output end of said optical combiner to said input end of said optical switch means;

a second optical fiber connecting said first output end of said optical switch means to said second input end of said optical combiner;

said optical combiner, said optical switch means in said straight-through state, and said optical fibers forming a closed optical loop capable of storing a recirculating optical pulse in said closed loop;

said first input end of said optical combiner serving as an input means to said optical loop;

said second output end of said optical switch means serving as an output means from said optical loop when said optical switch means is in said cross-over state; and means responsive to said control signals for controlling the input of an optical pulse through the input means of said memory cell and for controlling the output of said pulse from the output means of said cell; and wherein said optical switch means is in said straight-through state during the input and storage of an optical pulse, and is in said cross-over state during the output of said pulse.

2. The optical memory cell of claim 1 further comprising: an optical amplifier positioned within said loop to compensate for optical losses incurred by an optical pulse circulating within said loop.

3. The optical memory cell of claim 1 wherein said optical switch means is an electro-optical switch.

4. The optical memory cell of claim 1 wherein said optical switch means is a directional coupler.

5. The optical memory cell of claim 1 wherein said optical switch means is a cross-coupler.

6. The optical memory cell of claim 1 wherein said optical switch means is a nonlinear optical coupler.

7. The optical memory cell of claim 1 wherein said optical combiner is a fiber coupler.

8. The optical memory cell of claim 1 wherein said optical combiner is a waveguide coupler.

9. An optical memory cell, comprising:

an optical switch means having an input end adapted to receive an optical pulse, a first output end, a second output end and a switch control means, said switch means being adapted in response to control signals from said switch control means to switchably couple an optical pulse from said input end to said first output end in a straight-through state and to switchably couple an optical pulse from said input end to said second output end in a cross-over state;

an optical combiner having a first and a second input ends and an output end, adapted to receive an optical pulse on either input end and output said optical pulse on said output end;

a first optical fiber connecting said output end of said optical combiner to said input end of said optical switch means;

a second optical fiber connecting said first output end of said optical switch means to said second input end of said optical combiner;

said optical combiner, said optical switch means in said straight-through state, and said optical fibers forming a closed optical loop whose length is equal to the width of a single optical pulse, whereby said loop is capable of storing a recirculating optical pulse in said closed loop;

said first input end of said optical combiner serving as an input means to said optical loop;

said second output end of said optical switch means serving as an output means from said optical loop when said optical switch means is in said cross-over state; and means responsive to said control signals for controlling the input of an optical pulse through the input means of said memory cell and for controlling the output of said pulse from the output means of said cell; and wherein said optical switch means is in said straight-through state during the input and storage of an optical pulse, and is in said cross-over state during the output of said pulse.

10. The optical memory cell of claim 9 further comprising:

an optical amplifier positioned within said loop to compensate for optical losses incurred by an optical pulse circulating within said loop.

11. The optical memory cell of claim 9 wherein said optical switch means is an electro-optical switch.

12. The optical memory cell of claim 9 wherein said optical switch means is a directional coupler.

13. The optical memory cell of claim 9 wherein said optical switch means is a cross-coupler.

14. The optical memory cell of claim 9 wherein said optical switch means is a nonlinear optical coupler.

15. The optical memory cell of claim 9 wherein said optical combiner is a fiber coupler.

16. The optical memory cell of claim 9 wherein said optical combiner is a waveguide coupler.

* * * * *